(12) United States Patent
Qiao et al.

(10) Patent No.: US 12,464,766 B2
(45) Date of Patent: Nov. 4, 2025

(54) TERMINATION STRUCTURE OF SUPER-JUNCTION POWER DEVICE COMPRISING PLURALITY OF RUNWAY-SHAPED RINGS AS THE RESISTIVE FIELD PLATE

(71) Applicants: University of Electronic Science and Technology of China, Chengdu (CN); Institute of Electronic and Information Engineering of UESTC in Guangdong, Dongguan (CN)

(72) Inventors: Ming Qiao, Chengdu (CN); Ruidi Wang, Chengdu (CN); Yibing Wang, Chengdu (CN); Bo Zhang, Chengdu (CN)

(73) Assignees: University of Electronic Science and Technology of China, Chengdu (CN); Institute of Electronic and Information Engineering of UESTC in Guangdong, Dongguan (CN)

( * ) Notice: Subject to any disclaimer, the term of this patent is extended or adjusted under 35 U.S.C. 154(b) by 572 days.

(21) Appl. No.: 17/876,572

(22) Filed: Jul. 29, 2022

(65) Prior Publication Data
US 2023/0352576 A1 Nov. 2, 2023

(30) Foreign Application Priority Data
Apr. 28, 2022 (CN) .......................... 202210460657.0

(51) Int. Cl.
*H10D 30/66* (2025.01)
*H10D 62/10* (2025.01)
*H10D 64/00* (2025.01)

(52) U.S. Cl.
CPC ......... *H10D 30/665* (2025.01); *H10D 62/111* (2025.01); *H10D 64/115* (2025.01)

(58) Field of Classification Search
CPC .. H10D 30/665; H10D 62/111; H10D 64/115; H10D 12/441; H10D 62/106; H10D 30/66
See application file for complete search history.

(56) References Cited

U.S. PATENT DOCUMENTS

| 2008/0173935 | A1* | 7/2008 | Miyajima | H10D 62/051 438/479 |
| 2010/0118455 | A1* | 5/2010 | Kusunoki | H10D 62/127 257/E27.071 |

(Continued)

*Primary Examiner* — William B Partridge
*Assistant Examiner* — Ilker Ozden
(74) *Attorney, Agent, or Firm* — Bayramoglu Law Offices LLC

(57) ABSTRACT

A termination structure of a super-junction power device has a novel polysilicon resistive field plate at the top of a termination region between a transition region and an edge of the device. By utilizing the regular distribution of potential in the field plate, an additional electric field is introduced at the top of the termination structure to limit the expansion of a non-depletion region and optimize the distribution of charges. The termination structure includes a first doping type epitaxial layer, a second doping type compensation region, a second doping type body region, a second doping type lateral connection layer, a second doping type body contact region, a first doping type source contact region, a gate oxide layer, a passivation layer, a field oxide layer, a gate electrode, a second doping type edge contact region, a polysilicon resistive field plate, a metal layer and the like.

18 Claims, 7 Drawing Sheets

(56) References Cited

U.S. PATENT DOCUMENTS

| | | | |
|---|---|---|---|
| 2011/0204469 A1* | 8/2011 | Onishi | H10D 30/665 |
| | | | 257/490 |
| 2012/0326226 A1* | 12/2012 | Xiao | H10D 62/058 |
| | | | 257/329 |
| 2013/0099347 A1* | 4/2013 | Tamura | H10D 62/111 |
| | | | 257/493 |
| 2014/0151785 A1* | 6/2014 | Akagi | H10D 30/668 |
| | | | 257/329 |
| 2016/0049466 A1* | 2/2016 | Abiko | H10D 30/63 |
| | | | 257/329 |
| 2017/0229551 A1* | 8/2017 | Nakanishi | H10D 12/038 |
| 2019/0172934 A1* | 6/2019 | Lee | H10D 62/111 |

* cited by examiner

TERMINATION STRUCTURE OF SUPER-JUNCTION POWER DEVICE COMPRISING PLURALITY OF RUNWAY-SHAPED RINGS AS THE RESISTIVE FIELD PLATE

CROSS REFERENCE TO THE RELATED APPLICATIONS

This application is based upon and claims priority to Chinese Patent Application No. 202210460657.0, filed on Apr. 28, 2022, the entire contents of which are incorporated herein by reference.

TECHNICAL FIELD

The present invention belongs to the technical field of semiconductor, and in particular, relates to a termination structure of a super-junction power device, which is capable of enlarging design window and increasing process margin.

BACKGROUND

As core devices to manage high voltage and large current in power systems, power devices are widely applied in the fields of automobiles, power supplies, portable devices and the like. Vertical double-diffused metal-oxide-semiconductor field effect transistor (MOSFET) is an important kind of power devices used in power factor correction (PFC), DC-DC and many other power circuits. High breakdown voltage, low power loss and improved dynamic characteristics are the important trends in the development of power devices.

As the representative of the advanced power device, super-junction power devices realize ultralow specific on-resistance by its unique charge compensation technology, thereby remarkably improving efficiency and reducing system power loss. With the continuous scaling of the device cell pitch, the tolerance of charge balance for super-junction significantly declines, resulting in a smaller design window of the device and higher requirements on process control. Moreover, with the increasing demand for better dynamic characteristics of the super-junction power device, a termination structure with a lateral connection layer has been proposed and widely applied to high-voltage super-junction devices. Since the lateral connection layer is simultaneously depleted by the N-top layer, N-pillar and edge-epitaxial layer, the design window is further limited, and it becomes more difficult to achieve charge balance.

In order to solve the above technical problems, this invention introduces a resistive field plate in the termination region and provides a termination structure of super-junction power device, which is capable of enlarging design window and increasing process tolerance. Compared with the termination structure without resistive field plate, the termination region reaches the same breakdown voltage tolerance level as that of the cell region, so that the proposed structure is easier to maintain high breakdown voltage. The design window for the device is enlarged, the design flexibility is improved, and the process control difficulty is reduced.

SUMMARY

In order to achieve the aforementioned objective of the present invention, the technical solutions are as follows:

According to a termination structure of a super-junction power device, a polysilicon resistive field plate is arranged above a silicon layer; the polysilicon resistive field plate includes a plurality of runway-shaped rings surrounding a gate metal layer; each of the runway-shaped rings is formed by long straights, short straights, and curves; the runway-shaped rings have a first end connected to the gate metal layer and a second end connected to the edge metal layer; the first end and the second end are located on the long straights or the curves.

Preferably, the runway-shaped rings have equal width and are arranged at equal spacing, alternatively the runway-shaped rings have equal width and are arranged at variable spacings, or the runway-shaped rings have variable widths and are arranged at variable spacings.

Preferably, the runway-shaped rings are connected at intervals through connection segments perpendicular to the long straights on a straight line formed by the first end and the second end; alternatively, the runway-shaped rings are connected at intervals through connection segments perpendicular to tangent lines of the curves on a line segment formed by the first end and the second end and a line segment formed by diagonal positions of the first and second ends.

Preferably, each of the runway-shaped rings is not closed on one side or both sides of long straights, the adjacent runway-shaped rings are connected through connection segments perpendicular to the long straights at the position where the runway-shaped rings are not closed, and the connection segments are offset from the long straights to the curves at equal spacing from inside to outside.

Preferably, the runway-shaped rings are partitioned by a divider line located on the central axis of the long straights. The left and right sides of the runway-shaped rings are symmetrical about the divider line, and the rings are connected at intervals through connection segments perpendicular to the long straights on both sides of the divider line.

Preferably, the connection segment is made of polysilicon or metal.

Preferably, the first end is connected to the source metal layer instead of the gate metal layer.

Preferably, the number of the runway-shaped rings is greater than or equal to 6.

Preferably, the runway-shaped rings are replaced with an equal-width spiral line coiling around the gate metal layer, and the number of turns of the spiral line is greater than or equal to 6.

Preferably, the device may be an MOSFET, or may be an insulated gate bipolar transistor (IGBT) or other super-junction power devices.

Preferably, an active region A, a transition region B and a termination region C are arranged sequentially from the inside of the device to the edge of the device. The active region A, the transition region B and the termination region C share a first doping type substrate and a first doping type epitaxial layer.

The active region A includes: a plurality of second doping type compensation regions are located in and separated by the first doping type epitaxial layer; a second doping type body region is located on an upper surface of each of the second doping type compensation regions; a second doping type body contact region and a first doping type source contact region are located at the top of the second doping type body region; a gate oxide layer is located on upper surfaces of part of the first doping type epitaxial layer, part of the second doping type body region and part of the first doping type source contact region; a first gate electrode overlays an upper surface of the gate oxide layer; a passivation layer overlays upper surfaces of the first gate electrode and the first doping type source contact region; a source metal layer overlays upper surfaces of the second doping type body contact region, the first doping type source contact region and the passivation layer.

The transition region B includes: a plurality of second doping type compensation regions are located in and separated by the first doping type epitaxial layer; a second doping type body region is located on upper surfaces of the second doping type compensation regions; a second doping type body contact region is located at the top of the second doping type body region; a second doping type lateral connection layer is connected to the termination region and between the upper surfaces of the second doping type compensation regions and a bottom surface of the second doping type body region; a gate oxide layer is located on an upper surface of part of the second doping type body region; a field oxide layer is located on upper surfaces of part of the second doping type boy region and the first doping type epitaxial layer; a second gate electrode overlays the gate oxide layer and the field oxide layer; a passivation layer overlays the second gate electrode; a source metal layer overlays an upper surface of the second doping type body contact region; a gate metal layer is located at the top of the passivation layer and the second gate electrode, and the gate metal layer is in contact with the second gate electrode.

The termination region C includes: a plurality of second doping type compensation regions are located in and separated by the first doping type epitaxial layer; a second doping type lateral connection layer is connected to the transition region and on upper surfaces of the second doping type compensation regions; a field oxide layer overlays an upper surface of the first doping type epitaxial layer; a polysilicon resistive field plate is located above the field oxide layer; a passivation layer overlays the upper surfaces of the field oxide layer and the polysilicon resistive field plate; a second doping type edge contact region is located at the edge of the device and at the top of the first doping type epitaxial layer; an edge metal layer is located at the edge of the device, at the top of the passivation layer, and in contact with the second doping type edge contact region.

Preferably, the first doping type is n-type and the second doping type is p-type; alternatively, the first doping type is p-type and the second doping type is n-type.

The present invention has the following beneficial effects: compared with a termination structure without field plate, the proposed structure is easier to maintain high breakdown voltage, so that the fragile termination region reaches the same breakdown voltage tolerance level as that of the cell region. The design window for the device is enlarged, the design flexibility is improved, and the process control difficulty is reduced.

101: first doping type substrate; 102: first doping type epitaxial layer; 103: second doping type compensation region; 104: second doping type body region; 105: second doping type lateral connection layer; 106: second doping type body contact region; 107: first doping type source contact region; 108: gate oxide layer; 109: first gate electrode; 110: passivation layer; 111: field oxide layer; 112: second gate electrode; 113: second doping type edge contact region; 114: polysilicon resistive field plate; 115: source metal layer; 116: gate metal layer; 117: edge metal layer. 1: first end; 2: second end; 3: long straight; 4: short straight; 5: curve; 6: connection segment; 7: divider line.

DETAILED DESCRIPTION OF THE EMBODIMENTS

The implementation manners of the present invention are described below by the specific embodiments. Those skilled in the art may easily understand other advantages and effects of the present invention by the contents disclosed by the specification. The present invention can be implemented or applied through other different specific implementation manners. Various modifications or changes can be made to various details in the specification based on different viewpoints and applications without departing from the spirit of the present invention.

Embodiment 1

Figure 1:
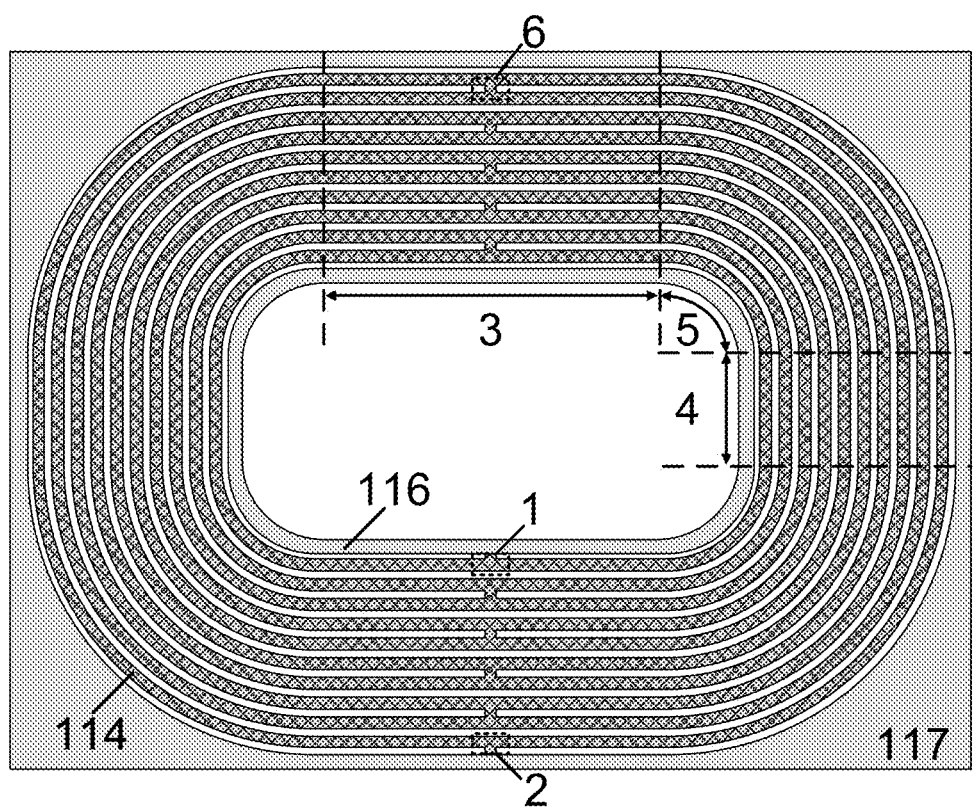
FIG. 1 is a schematic layout diagram of the termination field plate of a super-junction power device according to Embodiment 1.

This embodiment provides a termination structure of a super-junction power device. As shown in FIG. 1, a polysilicon resistive field plate 114 is arranged above a silicon layer. The polysilicon resistive field plate 114 includes a plurality of runway-shaped rings surrounding a gate metal layer 116. Each of the runway-shaped rings is formed by connecting long straights 3 in the middle of the upper side and the lower side, short straights 4 in the middle of the left side and the right side, and curves 5 as the junctions of the long straights 3 and the short straights 4. Each ring has equal width (d1) and equal spacing (d2), and the number of the runway-shaped rings is greater than or equal to 6. Each of the runway-shaped rings has a first end 1 connected to the gate metal layer 116 and a second end 2 connected to an edge metal layer 117. The first end 1 and the second end 2 are located on the long straights 3. The runway-shaped rings are connected at intervals through a connection segment 6 perpendicular to the long straights 3 on a straight line formed by the first end 1 and the second end 2.

Figure 2:
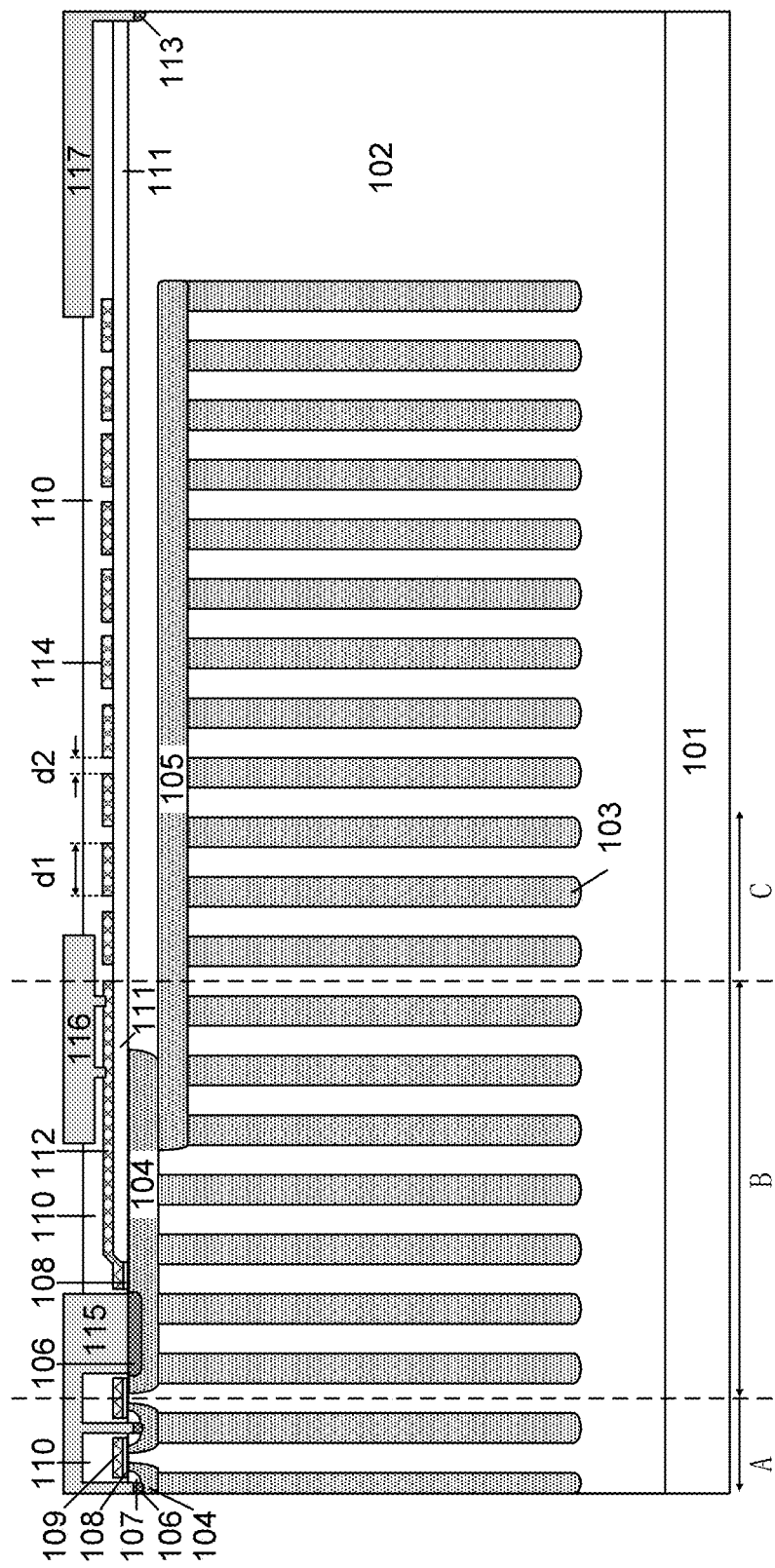
FIG. 2 is a schematic structural diagram of the termination of a super-junction power device according to Embodiment 1.

As shown in FIG. 2, an active region A, a transition region B and a termination region C are arranged sequentially from the inside of the device to the edge of the device, and the active region A, the transition region B and the termination region C share a first doping type substrate 101 and a first doping type epitaxial layer 102.

The active region A includes: a plurality of second doping type compensation regions 103 are located in the first doping type epitaxial layer 102 and separated by the first doping type epitaxial layer 102; a second doping type body region 104 is located on an upper surface of each of the second doping type compensation regions 103; a second doping type body contact region 106 and a first doping type source contact region 107 are located at the top of the second doping type body region 104; a gate oxide layer 108 is located on upper surfaces of part of the first doping type epitaxial layer 102, part of the second doping type body region 104 and part of the first doping type source contact region 107; a first gate electrode 109 overlays an upper surface of the gate oxide layer 108; a passivation layer 110 overlays upper surfaces of the first gate electrode 109 and the first doping type source contact region 107; a source metal layer 115 overlays upper surfaces of the second doping type body contact region 106, the first doping type source contact region 107 and the passivation layer 110.

The transition region B includes: a plurality of second doping type compensation regions 103 are located in the first doping type epitaxial layer 102 and separated by the first doping type epitaxial layer 102; a second doping type body region 104 is located on upper surfaces of the second doping type compensation regions 103; a second doping type body contact region 106 is located at the top of the second doping type body region 104; a second doping type lateral connection layer 105 is located close to the termination region and between the upper surfaces of the second doping type compensation regions 103 and a bottom surface of the second doping type body region 104; a gate oxide layer 108 is located on an upper surface of part of the second doping type body region 104; a field oxide layer 111 is located on upper surfaces of part of the second doping type boy region 104 and the first doping type epitaxial layer 102; a second gate electrode 112 overlays the gate oxide layer 108 and the field oxide layer 111; a passivation layer 110 overlays the second gate electrode 112; a source metal layer 115 overlays an upper surface of the second doping type body contact region 106; a gate metal layer 116 is located at the top of the passivation layer 110 and the second gate electrode 112, and the gate metal 116 is in contact with the second gate electrode 112.

The termination region C includes: a plurality of second doping type compensation regions 103 are located in the first doping type epitaxial layer 102 and separated by the first doping type epitaxial layer 102; a second doping type lateral connection layer 105 is located close to the transition region and on upper surfaces of the second doping type compensation regions 103; a field oxide layer 111 overlays an upper surface of the first doping type epitaxial layer 102; a polysilicon resistive field plate 114 is located above the field oxide layer 111; a passivation layer 110 overlays the upper surfaces of the field oxide layer 111 and the polysilicon resistive field plate 114; a second doping type edge contact region 113 is located close to the edge of the device and at the top of the first doping type epitaxial layer 102; an edge metal layer 117 is located close to the edge of the device, at the top of the passivation layer 110, and in contact with the second doping type edge contact region 113. The first doping type is n-type and the second doping type is p-type; alternatively, the first doping type is p-type and the second doping type is n-type.

The polysilicon resistive field plate 114 can be obtained through two kinds of processes: one is to deposit polysilicon for resistive field plate and gate electrodes in the same process step, then etch by a mask, and finally perform impurity doping; the other one is to perform vapor deposition and etching for semi-insulating polysilicon after finishing forming gate electrodes. The former process is simple and low-cost, while the polysilicon field plate obtained by the latter process has lower leakage current. At off-state, if the doping concentration of the second doping type lateral connection layer 105 is higher than the optimal value, a non-depletion region which cannot sustain voltage will appear on the active region side. The electric potential of the region is smaller than the electric potential at the corresponding position in the polysilicon resistive field plate 114. At this time, the polysilicon resistive field plate 114 will introduce a new electric field to assist in depleting the non-depletion region. The more the imbalanced charges, the stronger the new electric field. When the doping concentration of the second doping type lateral connection layer 105 is lower than the optimal value, a non-depletion region which cannot sustain voltage appears at the edge of the device. The electric potential of the region is higher than the electric potential at the corresponding position in the polysilicon resistive field plate 114. At this time, the polysilicon resistive field plate 114 will introduce another electric field with the opposite direction of the new electric field mentioned above to assist in depleting the non-depletion region. The more the imbalanced charges, the stronger the electric field. The opposite direction electric fields introduced by the polysilicon resistive field plate 114 at both ends of the second doping type lateral connection layer 105 can assist in depleting the internal non-depletion regions, enabling the charges in the second doping type lateral connection layer 105 to remain in a balanced state even when the doping concentration deviates, thus achieving dynamic balance.

Figure 3:
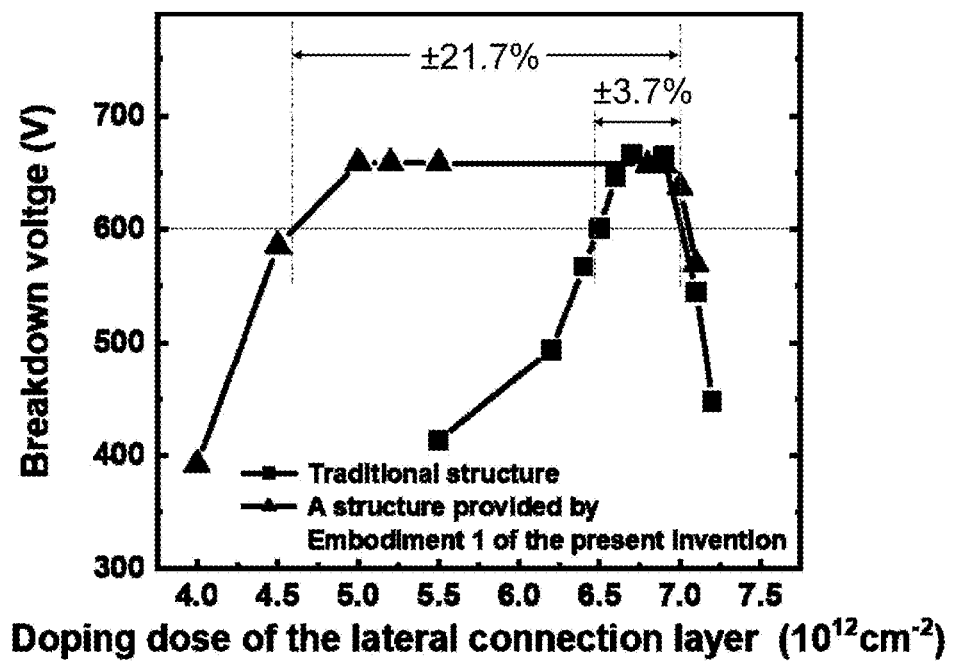
FIG. 3 is a curve chart of breakdown voltage of the termination structure of a super-junction power device according to Embodiment 1 and a termination structure without field plate as a function of the doping concentration of the lateral connection layer.
Figure 4:
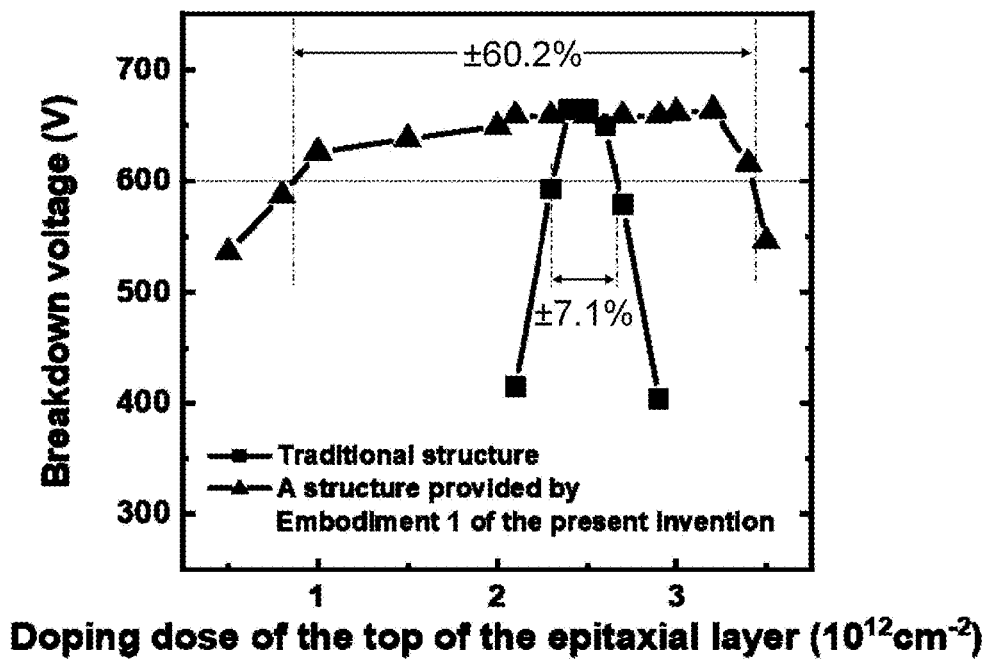
FIG. 4 is a curve chart of breakdown voltage of the termination structure of a super-junction power device according to Embodiment 1 and a termination structure without field plate as a function of the doping concentration of the top of the epitaxial layer.
Figure 5:
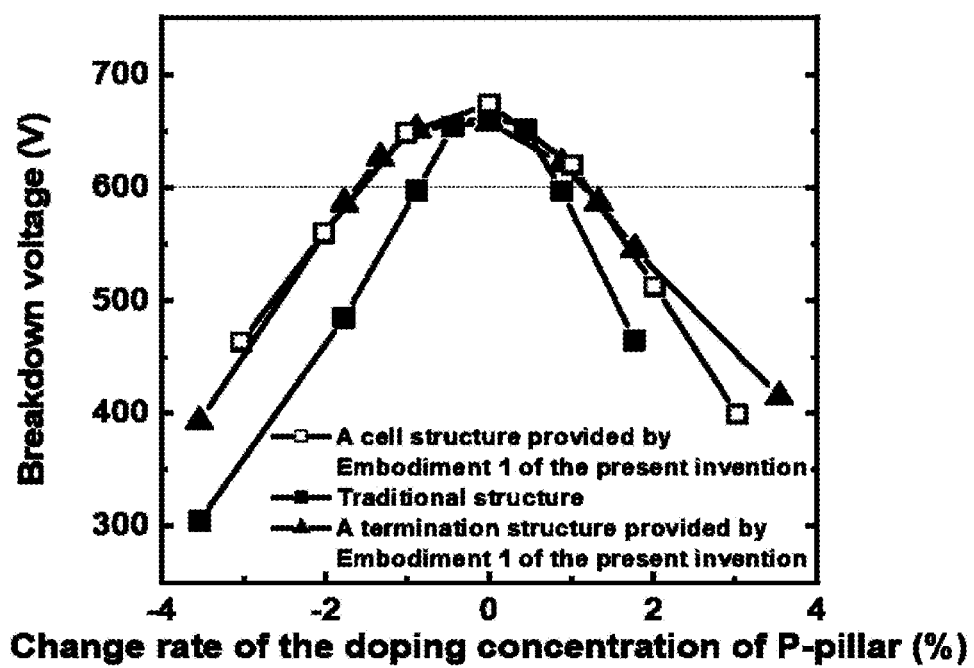
FIG. 5 is a curve chart of breakdown voltage of the termination structure of a super-junction power device according to Embodiment 1 and a termination structure without field plate as a function of the doping concentration of P-pillar.

FIG. 3 shows the breakdown voltage of the termination structure provided by this embodiment and the termination structure without the field plate as a function of the doping concentration of the second doping type lateral connection layer 105. As the figure shows, the change range of the doping concentration of the second doping type lateral connection layer 105 is +3.7% for the termination structure without the field plate to keep its breakdown voltage over 600V. In contrast, the corresponding change range of the structure provided by this embodiment is +21.7%, which is over five times higher than that of the termination structure without the field plate. As FIG. 4. shows, the change range of the doping concentration of the top of the first doping type epitaxial layer 102 is +7.1% for the termination structure without the field plate to keep the breakdown voltage over 600V. In contrast, the corresponding change range of the structure provided by this embodiment is +60.2%, which is over seven times higher than that of the termination structure without the field plate. FIG. 5 shows the breakdown voltage of the termination structure provided by this embodiment, the structure of the active region A according to this embodiment and the termination structure without the field plate as a function of the doping concentration of the second doping type compensation region 103. The breakdown voltage of the termination structure provided by this embodiment reaches the same level as that of the active region A, which is significantly higher than the breakdown voltage of the one without the field plate.

In conclusion, the termination structure of the super-junction power device provided by this embodiment has high breakdown voltage and larger design window, and can reduce the process control difficulty.

Embodiment 2

Figure 6:
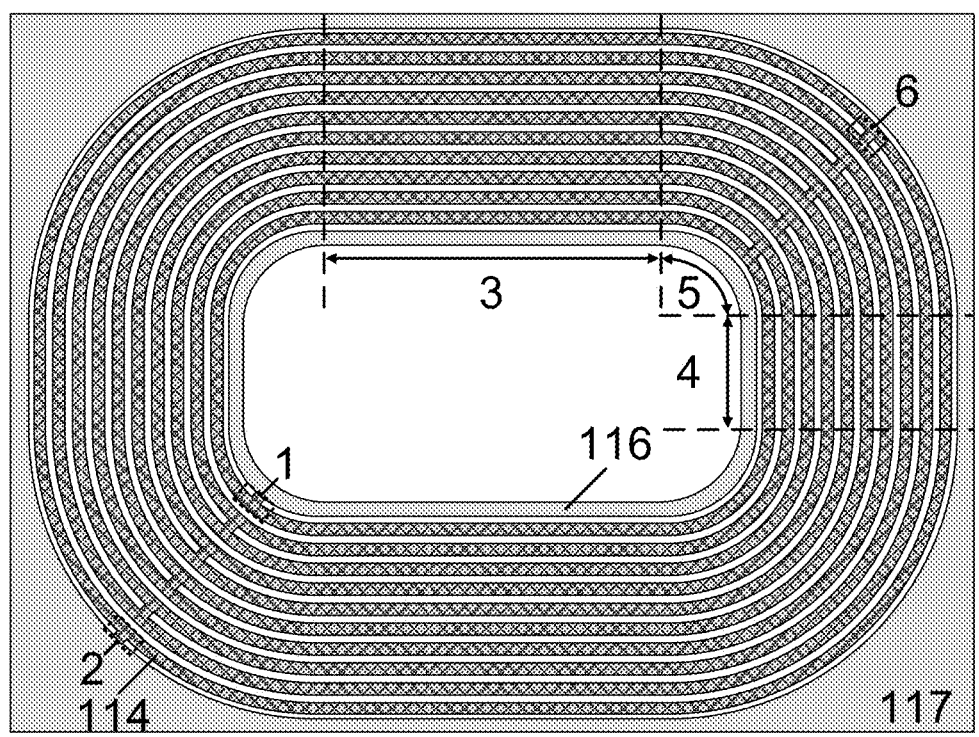
FIG. 6 is a schematic layout diagram of the termination field plate of a super-junction power device according to Embodiment 2.

As shown in FIG. 6, the present invention further provides a layout manner of the polysilicon resistive field plate 114, which is different from Embodiment 1 in that: a first end 1 and a second end 2 of the runway-shaped rings are located at the curves, and the runway-shaped rings are connected at intervals through a connection segment 6 perpendicular to tangent lines of the curves on a line segment formed by the first end 1 and the second end 2 and a line segment formed by diagonal positions of the first end 1 and the second end 2.

Compared with Embodiment 1, the connection positions between the polysilicon resistive field plate 114 and the metal and each ring of the polysilicon resistive field plate 114 are transferred from the straights to the curves. Since the two adjacent plates are connected at intervals through a connection segment 6, the number of equipotential areas is reduced. The connection segments 6 also reduce electric field intensity, which can suppress the electric field concentration caused by curvature effect, leading to larger design window.

Embodiment 3

Figure 7:
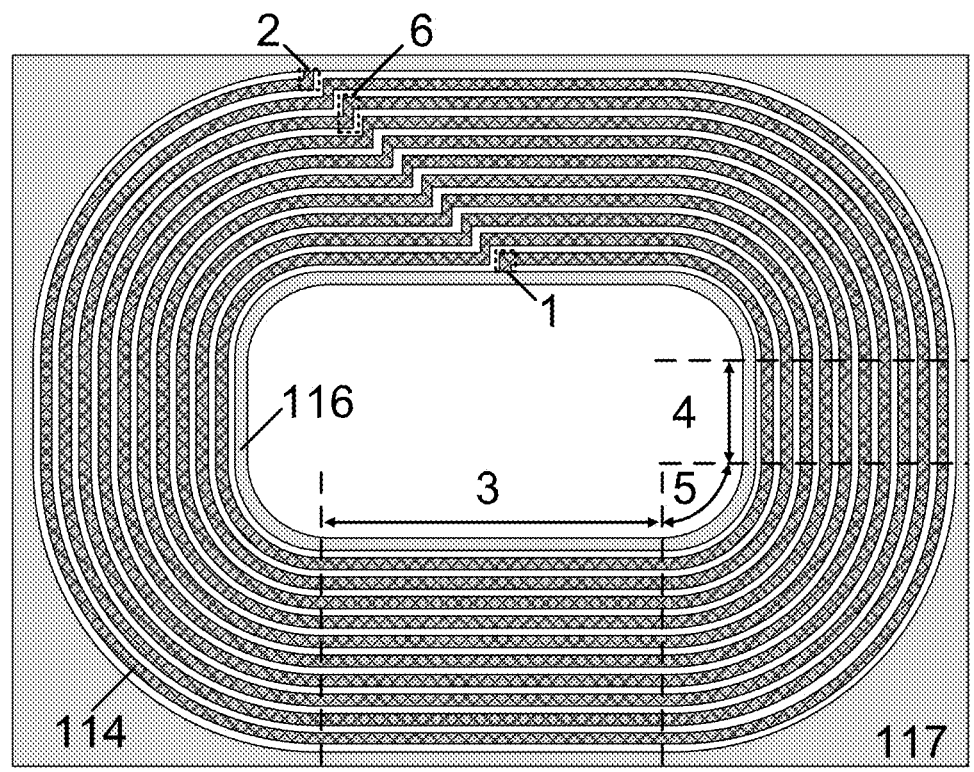
FIG. 7 is a schematic layout diagram of the termination field plate of a super-junction power device according to Embodiment 3.

As shown FIG. 7, the present invention further provides a layout manner of the polysilicon resistive field plate 114, which is different from Embodiment 1 in that: each of the runway-shaped rings is not closed on the upper or lower long straights 3, the adjacent runway-shaped rings are connected through a connection segment 6 perpendicular to the long straight 3 at the position where the runway-shaped rings are not closed, and the connection segments 6 are offset from the central axes of the long straights 3 to the curves 5 at equal spacing from inside to outside. In this embodiment, the polysilicon resistive field plate 114 consists of a single field plate, and the potential in the field plate drops in the same direction.

Embodiment 4

Figure 8:
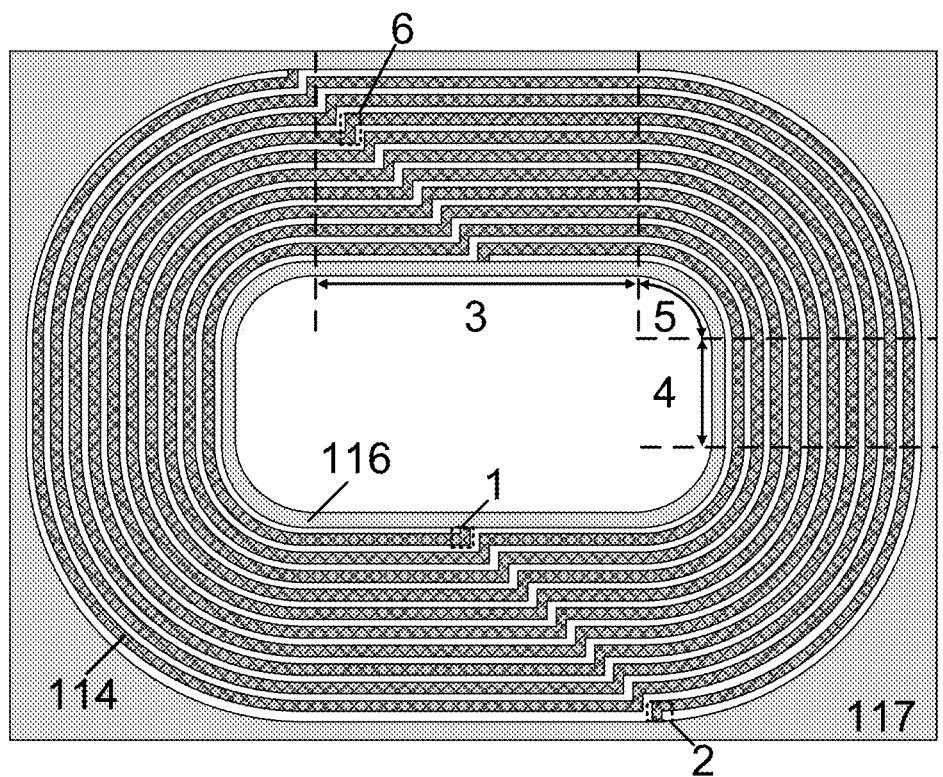
FIG. 8 is a schematic layout diagram of the termination field plate of a super-junction power device according to Embodiment 4.

As shown in FIG. 8, the present invention further provides a layout manner of the polysilicon resistive field plate 114, which is different from Embodiment 1 in that: each of the runway-shaped rings is not closed on the upper and lower long straights 3, the adjacent runway-shaped rings are connected through a connection segment 6 perpendicular to the long straights 3 at the position where the runway-shaped rings are not closed, and the connection segments 6 are offset from central axis of the long straights 3 to the curves 5 at equal spacing from inside to outside. In this embodiment, the polysilicon resistive field plate 114 consists of two field plates, and the potentials in the two field plates drop in the same direction.

Embodiment 5

Figure 9:
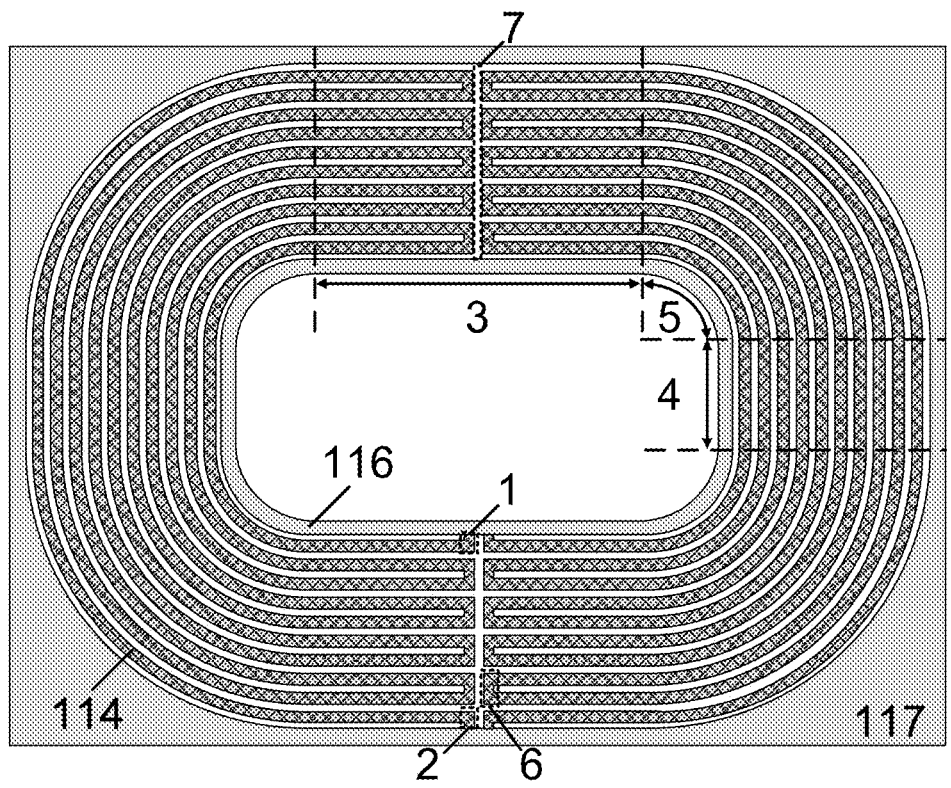
FIG. 9 is a schematic layout diagram of the termination field plate of a super-junction power device according to Embodiment 5.

As shown in FIG. 9, the present invention further provides a layout manner of a polysilicon resistive field plate 114, which is different from Embodiment 1 in that: the runway-shaped rings are partitioned by the divider line 7 located on the central axis of the long straights 3, the left and right sides of the runway-shaped rings are symmetrical about the divider line 7, and the adjacent runway-shaped rings are connected at intervals through a connection segment 6 perpendicular to the long straights 3 on both sides of the divider line 7. In this embodiment, the polysilicon resistive field plate 114 consists of two field plates, and the potentials in the two field plates drop in the opposite directions.

Embodiment 6

Figure 10:
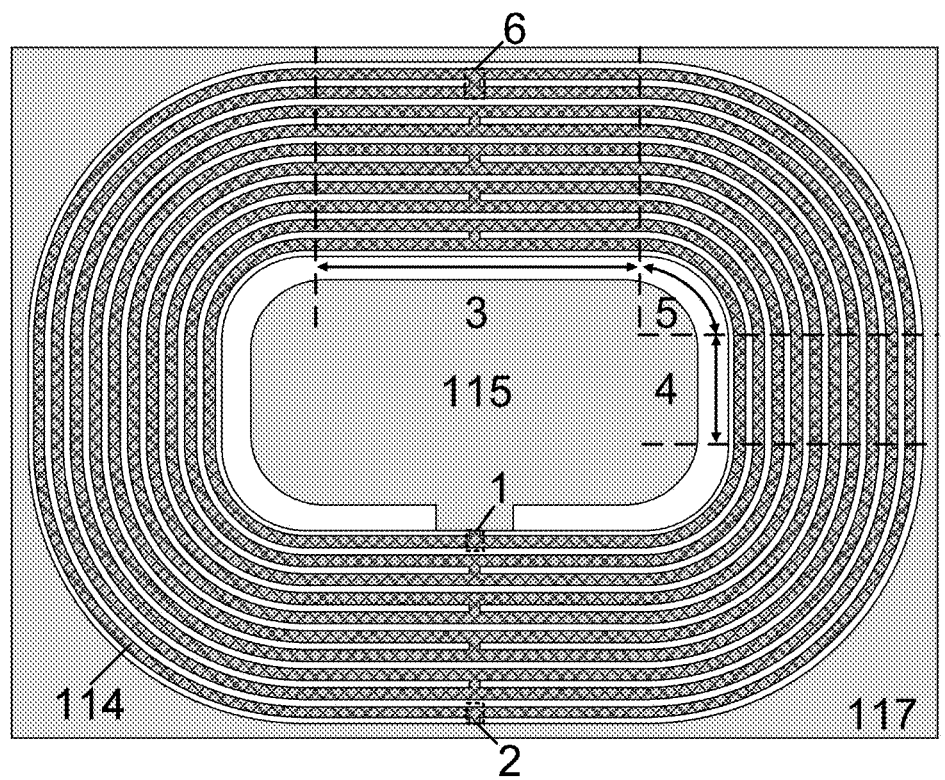
FIG. 10 is a schematic layout diagram of the termination field plate of a super-junction power device according to Embodiment 6.

As shown in FIG. 10, the present invention further provides a layout manner of the polysilicon resistive field plate 114, which is different from Embodiment 1 in that: the first end 1 is connected to the source metal layer 115 instead of the gate metal layer 116.

Compared with Embodiment 1, the connection manner of the polysilicon resistive field plate 114 is changed from connecting with gate and drain to connecting with source and drain, so that the leakage current of the gate electrode can be reduced. Hence, the gate charging time can be shortened, bringing faster turn-on process and high operating frequency.

Embodiment 7

Figure 11:
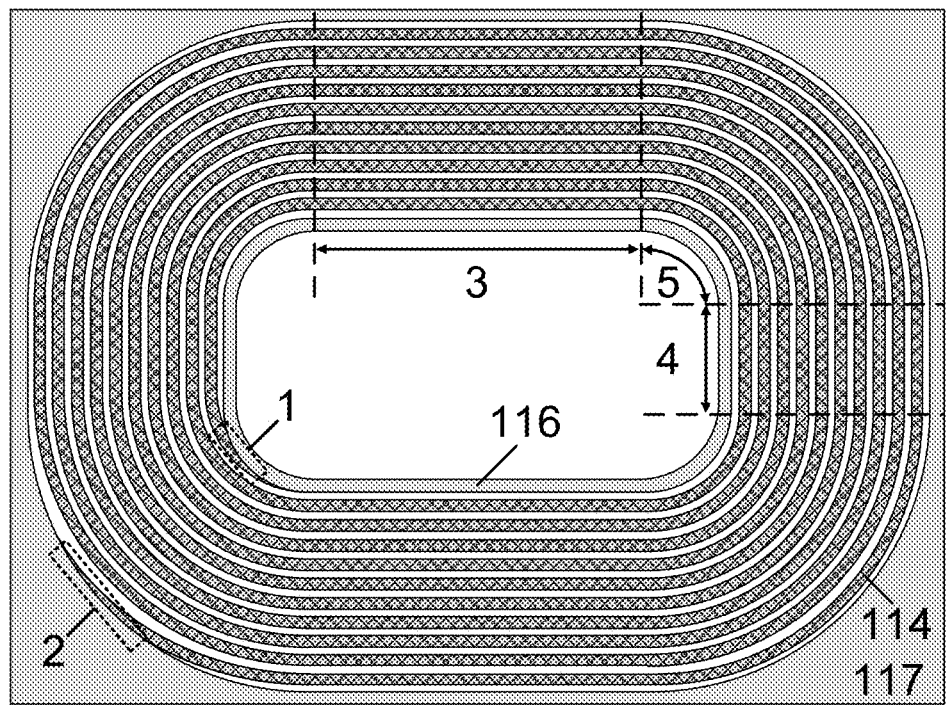
FIG. 11 is a schematic layout diagram of the termination field plate of a super-junction power device according to Embodiment 7.

As shown in FIG. 11, the present invention further provides a layout manner of a polysilicon resistive field plate 114: the runway-shaped rings are replaced with an equal-width spiral line coiling around the gate metal layer 116, and the number of turns of the spiral line is greater than or equal to 6.

The above embodiments are only intended to exemplarily illustrate the principle and effect of the present invention, but not intended to limit the present invention. Any person skilled in the art can modify or change the above embodiments without departing from the spirit and scope of the present invention. Therefore, all equivalent modifications or changes made by those with ordinary knowledge in the art without departing the spirit and technical ideal disclosed by the present invention should still be covered within the claims of the present invention.

What is claimed is:

1. A termination structure of a super-junction power device, wherein a polysilicon resistive field plate is arranged above a silicon layer; the polysilicon resistive field plate comprises a plurality of runway-shaped rings surrounding a gate metal layer; each of the plurality of runway-shaped rings is formed by connecting long straights in a middle of an upper side and a lower side, short straights in a middle of a left side and a right side, and curves between the long straights and the short straights; the plurality of runway-shaped rings have a first end directly connected to the gate metal layer and a second end directly connected to an edge metal layer; the first end and the second end are located on the long straights or the curves; and the plurality of runway-shaped rings are directly connected to each other.

2. The termination structure of the super-junction power device according to claim 1, wherein the plurality of runway-shaped rings have equal width and are arranged at equal spacing; alternatively, the plurality of runway-shaped rings have equal width and are arranged at variable spacings; alternatively, the plurality of runway-shaped rings have variable widths and are arranged at variable spacings.

3. The termination structure of the super-junction power device according to claim 1, wherein the plurality of runway-shaped rings are connected at intervals through connection segments perpendicular to the long straights on a straight line formed by the first end and the second end; alternatively, the plurality of runway-shaped rings are connected at intervals through connection segments perpendicular to tangent lines of the curves on a line segment formed by the first end and the second end and a line segment formed by diagonal positions of the first end and the second end.

4. The termination structure of the super-junction power device according to claim 1, wherein each of the plurality of runway-shaped rings is not closed on the upper or lower long straights or upper and lower long straights, adjacent runway-shaped rings are connected through connection segments perpendicular to the long straights at a position where the plurality of runway-shaped rings are not closed, and the connection segments are offset from the long straights to the curves at equal spacing from inside to outside.

5. The termination structure of the super-junction power device according to claim 1, wherein the plurality of runway-shaped rings are partitioned by a divider line located on a central axis of the long straights; left and right sides of the plurality of runway-shaped rings are symmetrical about the divider line, and the plurality of runway-shaped rings are connected at intervals through connection segments perpendicular to the long straights on both sides of the divider line.

6. The termination structure of the super-junction power device according to claim 3, wherein the connection segment is made of polysilicon or metal.

7. The termination structure of the super-junction power device according to claim 1, wherein the first end is connected to the source metal layer instead of the gate metal layer.

8. The termination structure of the super-junction power device according to claim 1, wherein a number of the plurality of runway-shaped rings is greater than or equal to 6.

9. The termination structure of the super-junction power device according to claim 1, wherein the plurality of runway-shaped rings are replaced with an equal-width spiral line coiling around the gate metal layer, and a number of turns of the equal-width spiral line is greater than or equal to 6.

10. The termination structure of the super-junction power device according to claim 1, wherein the super-junction power device is a metal-oxide-semiconductor field effect transistor (MOSFET), an insulated gate bipolar-translater transistor (IGBT) or other power super-junction power devices adapted to super-junction structures.

11. The termination structure of the super-junction power device according to claim 1, wherein an active region A, a transition region B and a termination region C are arranged sequentially from an inside of the super-junction power device to an edge of the super-junction power device; the active region A, the transition region B and the termination region C share a first doping type substrate and a first doping type epitaxial layer; wherein in the active region A, a plurality of second doping type compensation regions are located in and separated by the first doping type epitaxial layer; a second doping type body region is located on an upper surface of each of the plurality of second doping type compensation regions; a second doping type body contact region and a first doping type source contact region are located at a top of the second doping type body region; a gate oxide layer is located on upper surfaces of part of the first doping type epitaxial layer, part of the second doping type body region and part of the first doping type source contact region; a first gate electrode overlays an upper surface of the gate oxide layer; a passivation layer overlays upper surfaces of the first gate electrode and the first doping type source contact region; a source metal layer overlays upper surfaces of the second doping type body contact region, the first doping type source contact region and the passivation layer;

in the transition region B, a plurality of second doping type compensation regions are located in and separated by the first doping type epitaxial layer; a second doping type body region is located adjacent to the active region and on upper surfaces of the plurality of second doping type compensation regions; a second doping type body contact region is located at a top of the second doping type body region; a second doping type lateral connection layer is located adjacent to the termination region and between the upper surfaces of the plurality of second doping type compensation regions and a bottom surface of the second doping type body region; a gate oxide layer is located on an upper surface of part of the second doping type body region; a field oxide layer is located on upper surfaces of part of the second doping type boy region and the first doping type epitaxial layer; a second gate electrode overlays the gate oxide layer and the field oxide layer; a passivation layer overlays the second gate electrode; a source metal layer overlays an upper surface of the second doping type body contact region; a gate metal layer is located at a top of the passivation layer and the second gate electrode, and the gate metal is in contact with the second gate electrode; and in the termination region C, a plurality of second doping type compensation regions are located in and separated by the first doping type epitaxial layer; a second doping type lateral connection layer is located adjacent to the transition region and on upper surfaces of the plurality of second doping type compensation regions; a field oxide layer overlays an upper surface of the first doping type epitaxial layer; a polysilicon resistive field plate is located above the field oxide layer; a passivation layer overlays the upper surfaces of the field oxide layer and the polysilicon resistive field plate; a second doping type edge contact region is located adjacent to the edge of the super-junction power device and at a top of the first doping type epitaxial layer; an edge metal layer is located adjacent to the edge of the super-junction power device, at the top of the passivation layer, and in contact with the second doping type edge contact region.

12. The termination structure of the super-junction power device according to claim 11, wherein a first doping type is n-type and a second doping type is p-type; alternatively, the first doping type is p-type and the second doping type is n-type.

13. The termination structure of the super-junction power device according to claim 4, wherein the connection segment is made of polysilicon or metal.

14. The termination structure of the super-junction power device according to claim 5, wherein the connection segment is made of polysilicon or metal.

15. The termination structure of the super-junction power device according to claim 2, wherein the first end is directly connected to the source metal layer instead of the gate metal layer.

16. The termination structure of the super-junction power device according to claim 3, wherein the first end is directly connected to the source metal layer instead of the gate metal layer.

17. The termination structure of the super-junction power device according to claim 6, wherein the first end is directly connected to the source metal layer instead of the gate metal layer.

18. The termination structure of the super-junction power device according to claim 2, wherein a number of the plurality of runway-shaped rings is greater than or equal to 6.

* * * * *